United States Patent
Forbes

(10) Patent No.: US 6,787,883 B1
(45) Date of Patent: *Sep. 7, 2004

(54) SILICON-GERMANIUM DEVICES FOR CMOS FORMED BY ION IMPLANTATION AND SOLID PHASE EPITAXIAL REGROWTH

(75) Inventor: Leonard Forbes, Corvallis, OR (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/132,157

(22) Filed: Aug. 11, 1998

Related U.S. Application Data

(62) Division of application No. 08/717,198, filed on Sep. 18, 1996, now Pat. No. 5,879,996.

(51) Int. Cl.[7] ............................................ H01L 31/117
(52) U.S. Cl. ...................................... 257/616; 257/192
(58) Field of Search ................................. 257/192, 616

(56) References Cited

U.S. PATENT DOCUMENTS

| | | | | |
|---|---|---|---|---|
| 4,295,897 A | * | 10/1981 | Tubbs et al. ................ | 257/369 |
| 4,394,181 A | | 7/1983 | Nicholas ..................... | 148/1.5 |
| 5,019,882 A | * | 5/1991 | Solomon et al. ............. | 257/281 |
| 5,145,794 A | | 9/1992 | Kase et al. ................... | 437/24 |
| 5,254,484 A | | 10/1993 | Hefner et al. ................ | 437/24 |
| 5,272,365 A | * | 12/1993 | Nakagawa .................... | 257/194 |
| 5,285,088 A | * | 2/1994 | Sato et al. ................... | 257/616 |
| 5,296,386 A | * | 3/1994 | Aronowitz et al. ......... | 257/409 |
| 5,298,435 A | | 3/1994 | Aronowitz et al. ........... | 437/24 |
| 5,312,766 A | | 5/1994 | Aronowitz et al. ........... | 437/24 |
| 5,426,069 A | * | 6/1995 | Selvakumar et al. ........ | 257/288 |
| 5,461,250 A | * | 10/1995 | Burghartz et al. .......... | 257/347 |
| 5,512,772 A | * | 4/1996 | Maeda et al. ................ | 257/616 |
| 5,801,396 A | * | 9/1998 | Chan et al. ................... | 257/65 |
| 5,818,100 A | * | 10/1998 | Grider et al. ................ | 257/616 |
| 5,821,577 A | * | 10/1998 | Crabbe' et al. .............. | 257/616 |
| 5,879,996 A | * | 3/1999 | Forbes ........................ | 438/289 |
| 5,889,292 A | * | 3/1999 | Sameshima et al. .......... | 257/65 |
| 6,118,151 A | * | 9/2000 | Tsutsu ........................ | 257/347 |

FOREIGN PATENT DOCUMENTS

JP           4-34942 A    *   2/1992

OTHER PUBLICATIONS

IEEE Electron Device Letters, vol. 12, No. 4, p. 154–156, Apr. 1991 by Nayah et al.*

English language translation of Japanese Kokai 4–34942, Feb. 2000.*

Berti, M., et al., "Composition and Structure of Si–Ge Layers Produced by Ion Implantation and Laser Melting", *J. Mater. Res.*, vol. 6, No. 10, pp. 2120–2126, (1991), 10/91.

(List continued on next page.)

*Primary Examiner*—Mark V. Prenty
(74) *Attorney, Agent, or Firm*—Schwegman, Lundberg, Woessner & Kluth, P.A.

(57) ABSTRACT

A PMOS transistor is formed in a CMOS integrated circuit, having a $Si_{1-x}Ge_x$/Si heterojunction between the channel region and the substrate. The method is applicable to large volume CMOS IC fabrication. Germanium is implanted into a silicon substrate, through a gate oxide layer. The substrate is then annealed in a low temperature furnace, to form $Si_{1-x}Ge_x$ in the channel region.

15 Claims, 2 Drawing Sheets

OTHER PUBLICATIONS

Berti, M., et al., "Laser Induced Epitaxial Regrowth of Si–xGex/Si Layers Produced by Ge Ion Implantation", *Appl. Surf. Sci.* vol. 43, pp. 158–164, (1989), 1/89.

Chilton, B.T., et al., "Solid Phase Epitaxial Regrowth of Strained Si1–xGex/Si Strained–layer Structures Amorphized by Ion Implantation", *Appl. Phys. Lett.,* vol. 54, No. 1, pp. 42–44, (1989), 1/89.

Myerson, B.S., et al., "SiGe–Channel Heterojunction p–MOSFET's", *IEEE Trans. on Electron Devices,* vol. ED–41, No. 1, pp. 90–100, (Jan. 1994).

Paine, D.C., et al., "The Growth of Strained Si–xGex Alloys on (100) Silicon Using Solid Phase Epitaxy", *J. Mater Re.,* vol. 5, No., pp. 1023–1031, (1995),5/90.

People, R., et al., "Calculation of critical layer thickness versus lattice mismatch for GexSi1–x/Si strained–layer heterostructures", *Appl. Phys. Lett.,* Erratum, 47, 322, (1985), 8/85.

Reedy, R., et al., "High Quality CMOS in Thin (100nm) Silicon on Sapphire", *IEEE Elect. Device Lett,* vol. 9, No. 1, pp 32–34, (Jan. 1988).

Wang, K.L., et al., "High Performance GeSi Quantum–Well PMOS on SIMOX", Proc. Int. Electron Device Meeting, San Francisco, pp. 777–778, (Dec. 1992).

Wolf, S., "Silicon Processing for the VLSI Era", *vol. 2: Process Integration,* Lattice Press, Sunset Beach, CA, 338–355, Table 5.2, 1990.

\* cited by examiner

SILICON-GERMANIUM DEVICES FOR CMOS FORMED BY ION IMPLANTATION AND SOLID PHASE EPITAXIAL REGROWTH This application is a division of U.S. Ser. No. 08/717,198 filed Sep. 18, 1996. and now U.S. Pat. No. 5,879,996.

FIELD OF THE INVENTION

The present invention relates to methods and apparatus for the manufacture of silicon-germanium semiconductor devices.

BACKGROUND OF THE INVENTION

Complementary metal-oxide-semiconductor (CMOS) technology is widely used in integrated circuits (ICs) due to the lower power consumption of CMOS ICs, as compared to previously preferred NMOS ICs. CMOS is so named because it uses both p- and n-channel transistors in its ICs. However, one of the most fundamental and serious limitations of CMOS technology resides in the p-channel device. Generic, one-micron processes reflect such limitations in the disparate field-effect mobilities associated with n-channel and p-channel devices within a CMOS IC. In such devices, p-channel field-effect hole mobility is approximately two to three times lower than n-channel field-effect electron mobility. Thus, in order to achieve optimum symmetrical switching and driving capabilities, p-channel devices must be more than twice as large as n-channel devices, which undesirably affects packing density of an IC.

To overcome device-operational limitations in bipolar technology, as used in amplifying and switching devices, silicon-germanium ($Si_{1-x}Ge_x$)/Si heterojunctions were developed. $Si_{1-x}Ge_x$ has an associated band gap that is smaller than that of the silicon. When such a material is used for the emitter material in a bipolar transistor, a higher emitter-injection efficiency is obtained due to the bandgap difference between the silicon base material and the emitter material. To form a $Si_{1-x}Ge_x$/Si heterojunction, molecular beam epitaxy (MBE) and ultrahigh-vacuum chemical vapor deposition (UHV CVD) are currently used.

It is desirable to adapt $Si_{1-x}Ge_x$/Si heterojunction technology to improving field-effect mobilities of p-channel MOS devices used in CMOS ICs. However, while MBE and UHV CVD are two methods for forming a $Si_{1-x}Ge_x$/Si heterojunction, both techniques are not compatible with large-scale manufacturing processes, such as commonly used to form CMOS ICs. MBE and UHV CVD are complicated and expensive. MBE and UHV CVD were developed for use in fabricating bipolar devices, which are intolerable towards microdefects and dislocations resulting from strained layers, due to their extremely small base widths, which require very sharp profiles and transitions. It was not critical to develop an efficient, high volume technique for the fabrication of $Si_{1-x}Ge_x$ layers. Thus, it has not been possible to adapt $Si_{1-x}Ge_x$/Si heterojunction technology to the large volume manufacture of CMOS ICs. MOS devices are much more tolerant of microdefects and dislocations, since there is no concern about emitter-collector shorts resulting from the extremely small base widths inherent in bipolar devices.

Furthermore, conventional silicon CMOS transistor gates are formed by thermally oxidizing the silicon substrate. When a $Si_{1-x}Ge_x$ layer is formed on a silicon substrate, by MBE or UHV CVD, stable gate oxides can not be later formed on the $Si_{1-x}Ge_x$ layer. Oxides of Ge are not stable, thus, other ways of forming a gate oxide layer are being investigated. One way of forming a stable gate oxide over a $Si_{1-x}Ge_x$ layer is by depositing low temperature CVD oxides. However, such oxides have a resulting undesirable higher surface state density. Another way of forming a stable gate oxide over a $Si_{1-x}Ge_x$ layer is by reoxidation of a silicon cap layer applied over the $Si_{1-x}Ge_x$ layer. However, using a silicon cap layer results in a buried channel structure with an undesirably large effective gate oxide thickness. Furthermore, at high gate voltages, many of the $Si_{1-x}Ge_x$ layer carriers migrate to the silicon cap layer. The net result is a loss in device performance.

There is a need for a method of large volume manufacturing of Si—Ge semiconductor devices. In particular, there is a need for a method of large volume manufacturing of silicon-germanium CMOS ICs, in which a stable gate oxide layer can exist over a $Si_{1-x}Ge_x$ transistor channel.

SUMMARY OF THE INVENTION

The present invention teaches a method and apparatus for large volume manufacturing of Si—Ge complementary metal-oxide-semiconductor (CMOS) integrated circuits (ICs). $Si_{1-x}Ge_x$ is formed under existing gate oxide layers, eliminating the problem of forming stable gate oxides directly over a $Si_{1-x}Ge_x$ layer. A high dose Ge layer is implanted under the gate oxide layer. Next, a $Si_{1-x}Ge_x$ layer is grown by solid phase epitaxial (SPE) regrowth, such that lattice mismatch is minimized between the $Si_{1-x}Ge_x$ layer and the underlying Si substrate. SPE is performed in a low temperature furnace, for approximately ten minutes. Implantation and anneal steps are commonplace in the large volume manufacture of CMOS ICs. Thus, this invention does not add significant cost or complexity to the manufacture of CMOS ICs, while providing the ability to manufacture high volume CMOS ICs with enhanced field effect hole mobility.

According to one aspect of the invention, the $Si_{1-x}Ge_x$ layer formed in this invention has a critical layer thickness, which depends on the molar fraction, x, of germanium present in the $Si_{1-x}Ge_x$ compound formed. As long as the critical layer thickness is not exceeded, $Si_{1-x}Ge_x$ will form defect-free during SPE regrowth. By forming p-channels in accordance with the method of the invention, valuable chip space is conserved, enabling high density chips to be formed. P-channel transistors are able to be formed in approximately the same amount of space as n-channel transistors due to the increased field effect hole mobility, while obtaining symmetrical switching and driving capabilities.

DESCRIPTION OF THE EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense, and the scope of the present invention is defined by the appended claims. Numbering in the Figures is usually done with the hundreds and thousands digits corresponding to the figure number, with the exception that the same components may appear in multiple figures.

In the manufacture of p-channel metal-oxide-semiconductor (PMOS), transistors for complementary metal-oxide-semiconductor (CMOS) integrated circuits (ICs) are formed, having $Si_{1-x}Ge_x$/Si heterojunctions. A $Si_{1-x}Ge_x$/Si heterojunction is formed between the substrate and the channel region. The presence of the heterojunction in each PMOS transistor substantially increases the speed of such devices due to an increase in the field-effect hole mobility. By increasing the speed of PMOS devices, they can be made smaller. Thus, chip density is improved.

Figure 1A:
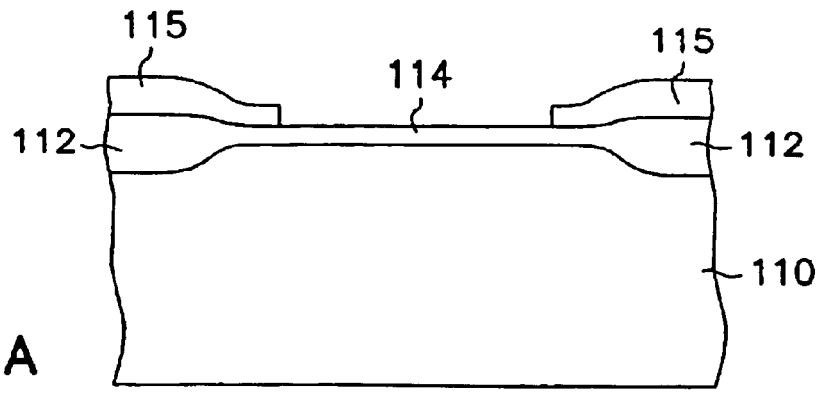
FIGS. 1A to 1C are cross-sectional representations of the method of forming Si—Ge CMOS ICs.

The first steps in the manufacture of a PMOS transistor in accordance with the method of the invention are those used in the conventional manufacture of PMOS transistors, as shown in FIG. 1A. These steps are: formation of active device areas on a silicon substrate 110, defined by field oxide 112 and growth of a gate oxide layer 114 on the silicon substrate 110, as well known to one skilled in the art The silicon substrate 112 is either a (n-) substrate or it comprises an (n-) well formed in a (p-) substrate.

Figure 1B:
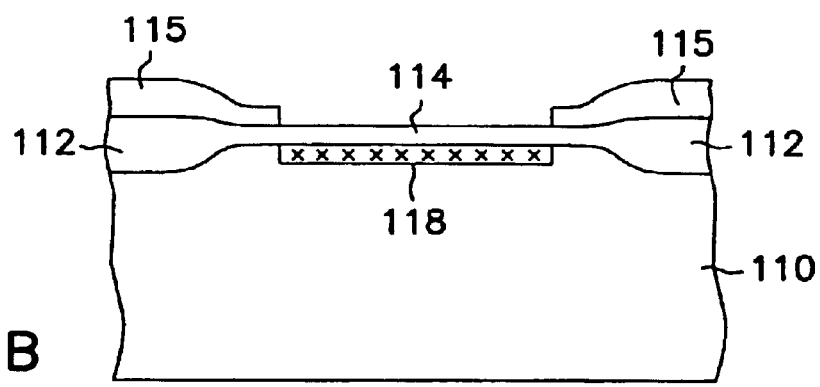

Next, a $Si_{1-x}Ge_x$ channel is formed under the existing gate oxide layer 114, shown in FIG. 1A, eliminating the problem of forming stable gate oxides directly over a $Si_{1-x}Ge_x$ layer. Using conventional photoresist masking and patterning techniques, all but the gate oxide layer 114 are protected from implantation with a photoresist layer 115. Then, a high dose (approximately $2 \times 10^{16}$ atoms/cm$^2$) of Ge is implanted under the gate oxide layer 114. The Ge is implanted to a depth of between 100 to 1,000 angstroms, preferably approximately 300 angstroms, to form an implanted region 118 as shown in FIG. 1B. The implant energy is less than 200 keV, preferably at an energy of approximately 20 to 100 keV, so as not to significantly damage the gate oxide layer 114. Subsequently, the photoresist layer 115 is removed.

Figure 1C:
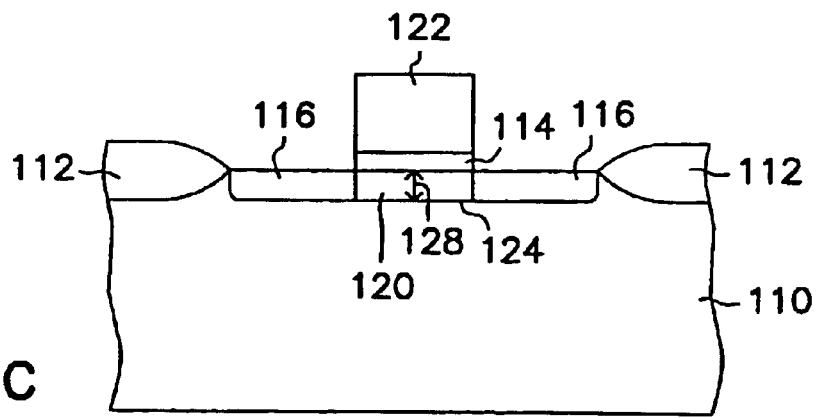

Next, the $Si_{1-x}Ge_x$ layer 120 for the channel, as shown in FIG. 1C, is grown by solid phase epitaxial (SPE) regrowth, such that lattice mismatch is minimized between the $Si_{1-x}Ge_x$ layer 120 and the underlying Si substrate 110. SPE is performed in a standard silicon processing low temperature furnace, for approximately ten minutes. The furnace temperature is approximately 450 to 700 degrees Celsius, preferably 550 degrees Celsius, to promote SPE regrowth.

A polysilicon gate 122 is then formed on the gate oxide layer 114, as shown in FIG. 1C, and source/drain regions 116 are implanted, as well known to one skilled in the art. The resulting structure contains a $Si_{1-x}Ge_x$/Si heterojunction 124 between the channel 120 and the substrate 10. Due to the higher hole mobility in germanium, the field-effect hole mobility is increased significantly, contributing to faster PMOS transistors. Implantation and anneal steps are commonplace in the manufacture of CMOS ICs. Thus, this invention does not add significant cost or complexity to the manufacture of CMOS ICs.

Figure 2:
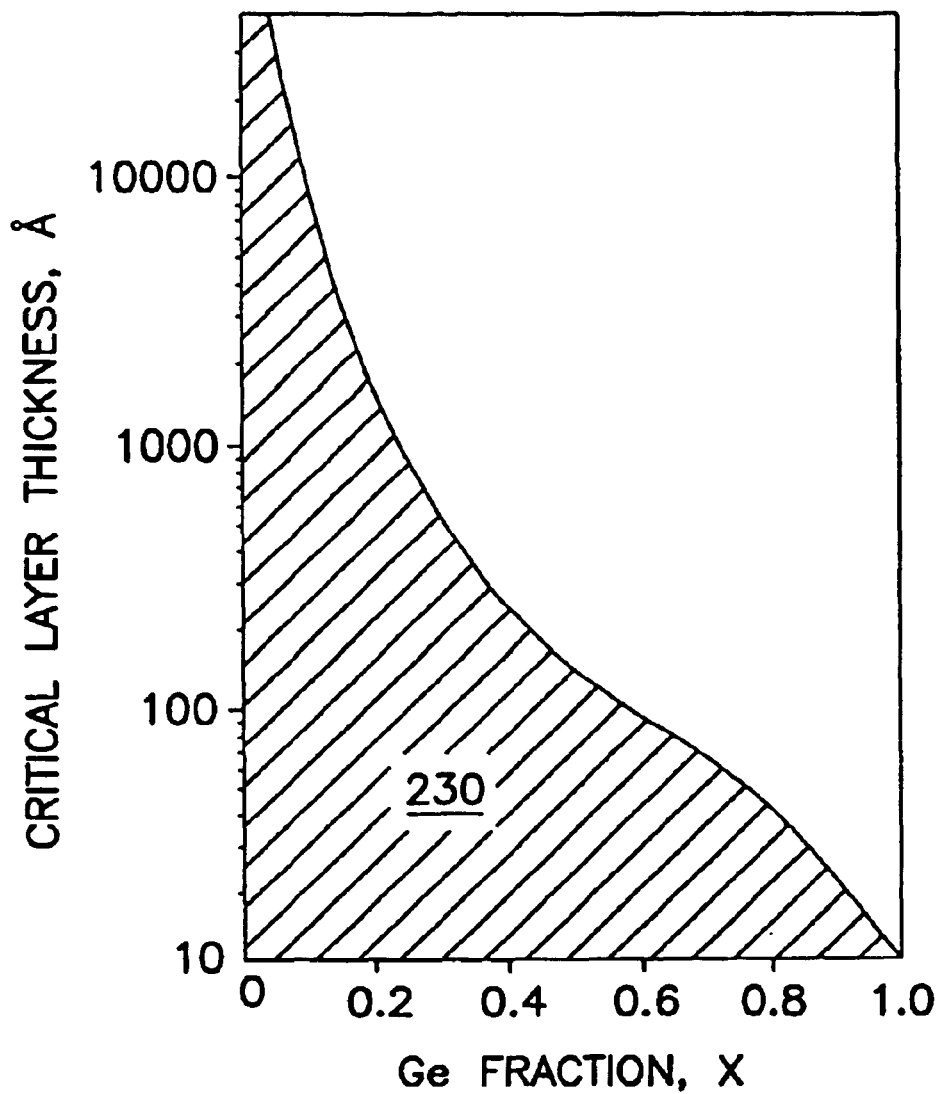
FIG. 2 is a graphical representation of the critical thickness of a $Si_{1-x}Ge_x$ layer with respect to the molar fraction of germanium, x, present in the layer.

The $Si_{1-x}Ge_x$ channel 120 formed in this invention has a thickness 128, as shown in FIG. 1C and the critical values of which are represented by the graph in FIG. 2. The critical thickness of the $Si_{1-x}Ge_x$ channel 120 depends on the molar fraction, x, of germanium present in the $Si_{1-x}Ge_x$ layer 120. As long as the critical layer thickness is not exceeded, $Si_{1-x}Ge_x$ 120 will form defect-free during SPE regrowth, as desired. The region 230 below and to the left of the plotted line in FIG. 2 is the permissible range of $Si_{1-x}Ge_x$ channel thickness 128 with respect to the molar fraction, x, of germanium. For example, when the molar fraction, x, of germanium is approximately 0.2, as preferred, it is preferable to form a $Si_{1-x}Ge_x$ channel 120, having a thickness 128 of approximately 100 angstroms to 1,000 angstroms, while staying within the critical thickness range.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A p-channel metal-oxide-semiconductor transistor, comprising:

a silicon substrate;

a silicon dioxide ($SiO_2$) gate oxide, coupled to the substrate;

a gate, coupled to the $SiO_2$ gate oxide;

source/drain regions formed in the substrate on opposite sides of the gate;

a $Si_{1-x}Ge_x$ channel region, having a germanium molar fraction x, located underneath the $SiO_2$ gate oxide and between the source/drain regions, wherein x is less than or equal to 0.6, and wherein the $Si_{1-x}Ge_x$ channel region forms a continuous $Si_{1-x}Ge_x$/$SiO_2$ gate oxide interface wherein no germanium oxide is present at the Si1–xGex/SiO2 gate oxide interface; and wherein the $Si_{1-x}Ge_x$ channel region is formed from ion implanting Germanium (Ge) into the substrate at a dose of approximately $2 \times 10^{16}$ atoms/cm$^2$, and wherein the Ge is implanted at an energy of approximately 20 to 100 keV.

2. The transistor of claim 1, wherein the $Si_{1-x}Ge_x$ channel is approximately 100 to 1,000 angstroms thick.

3. The transistor of claim 1, wherein the molar fraction of germanium is approximately 0.2.

4. A p-channel metal-oxide-semiconductor transistor formed on a silicon substrate, comprising:

a $Si_{1-x}Ge_x$ channel region, having a germanium molar fraction of x, and formed in the substrate, underneath a silicon dioxide ($SiO_2$) gate oxide and between a source region and a drain region;

wherein x is less than or equal to 0.6, and wherein the $Si_{1-x}Ge_x$ channel region forms a continuous $Si_{1-x}Ge_x$/$SiO_2$ gate oxide interface wherein no germanium oxide is present at the $Si_{1-x}Ge_x$/$SiO_2$ gate oxide interface; and wherein the $Si_{1-x}Ge_x$ channel region is formed from ion implanting germanium (Ge) into the substrate at a dose greater than or equal to $2 \times 10^{16}$ atoms/cm$^2$, and wherein the Ge is implanted at an energy of approximately 20 to 100 keV.

5. A p-channel metal-oxide-semiconductor transistor formed on a silicon substrate, comprising:

a $Si_{1-x}Ge_x$ channel region, having a germanium molar fraction of x, and formed in the substrate, underneath a silicon dioxide ($SiO_2$) gate oxide and between a source region and a drain region, wherein x is less than or equal to 0.6, and wherein the $Si_{1-x}Ge_x$ channel region forms a continuous $Si_{1-x}Ge_x$/$SiO_2$ gate oxide interface wherein no germanium oxide is present at the $Si_{1-x}Ge_x$/

SiO$_2$ gate oxide interface as a result of ion implantation of germanium through the previously formed SiO$_2$ gate oxide; and wherein the Si$_{1-x}$Ge$_x$ channel region is formed from ion implanting germanium (Ge) into the substrate at a dose of approximately 2×10$^{16}$ atoms/cm$^2$, and wherein the Ge is implanted at an energy of approximately 20 to 100 keV.

6. The transistor of claim 5, wherein the Ge is dispersed in the substrate to a depth of approximately 100 to 1,000 angstroms.

7. The transistor of claim 5, wherein the Ge is dispersed in the substrate to a depth of approximately 300 angstroms.

8. A p-channel metal-oxide-semiconductor transistor formed on a silicon substrate, comprising:

a Si$_{1-x}$Ge$_x$ channel region, having a germanium molar fraction of 0.2, and formed in the substrate, underneath a silicon dioxide (SiO$_2$) gate oxide and between a source region and a drain region, wherein the Si$_{1-x}$Ge$_x$ channel region forms a continuous Si$_{1-x}$Ge$_x$/SiO$_2$ gate oxide interface wherein no germanium oxide is present at the Si$_{1-x}$Ge$_x$/SiO$_2$ gate oxide interface; and wherein the Si$_{1-x}$Ge$_x$ channel region is formed from ion implanting Germanium (Ge) into the substrate at a dose of approximately 2×10$^{16}$ atoms/cm$^2$, and wherein the Ge is implanted at an energy of approximately 20 to 100 keV.

9. The transistor of claim 8, wherein, the Si$_{1-x}$Ge$_x$ channel region was formed by a process comprising:

annealing the substrate in a furnace at a temperature of approximately 450 to 700 degrees Celsius.

10. A semiconductor transistor, comprising:

a silicon substrate;

a silicon dioxide (SiO$_2$) gate oxide, coupled to the substrate;

a gate, coupled to the SiO$_2$ gate oxide;

source/drain regions formed in the substrate on opposite sides of the gate;

a Si$_{1-x}$Ge$_x$ channel region, having a germanium molar fraction of x, and located underneath the SiO$_2$ gate oxide and between the source/drain regions, wherein x is less than or equal to 0.6, and wherein the Si$_{1-x}$Ge$_x$ channel region forms a continuous Si$_{1-x}$Ge$_x$/SiO$_2$ gate oxide interface wherein no germanium oxide is present at the Si$_{1-x}$Ge$_x$/SiO$_2$ gate oxide interface; and wherein the Si$_{1-x}$Ge$_x$ channel region is formed from ion implanting germanium (Ge) into the substrate at a dose of approximately 2×10$^{16}$ atoms/cm$^2$, and wherein the Ge is implanted at an energy of approximately 20 to 100 keV.

11. The transistor of claim 10, wherein the Si$_{1-x}$Ge$_x$ channel is approximately 100 to 1,000 angstroms thick.

12. A semiconductor transistor formed on a silicon substrate, comprising:

a Si$_{1-x}$Ge$_x$ channel region, having a germanium molar fraction of 0.2 formed in the substrate, underneath a silicon dioxide (SiO$_2$) gate oxide and between a source region and a drain region, wherein the Si$_{1-x}$Ge$_x$ channel region forms a continuous Si$_{1-x}$Ge$_x$/SiO$_2$ gate oxide interface wherein no germanium oxide is present at the Si$_{1-x}$Ge$_x$/SiO$_2$ gate oxide interface, wherein the Si$_{1-x}$Ge$_x$ channel region is formed from ion implanting germanium (Ge) into the substrate at a dose of approximately 2×10$^{16}$ atoms/cm$^2$, and wherein the Ge is implanted at an energy of approximately 20 to 100 keV.

13. A semiconductor transistor formed on a silicon substrate, comprising:

a Si$_{1-x}$Ge$_x$ channel region, having a germanium molar fraction of x, and formed in the substrate, underneath a silicon dioxide (SiO$_2$) gate oxide and between a source region and a drain region, wherein x is less than or equal to 0.6, and wherein the Si$_{1-x}$Ge$_x$ channel region forms a continuous Si$_{1-x}$Ge$_x$/SiO$_2$ gate oxide interface wherein no germanium oxide is present at the Si$_{1-x}$Ge$_x$/SiO$_2$ gate oxide interface as a result of ion implantation of germanium through the previously formed SiO$_2$ gate oxide; and wherein the Si$_{1-x}$Ge$_x$ channel region is formed from ion implanting germanium (Ge) into the substrate at a dose of approximately 2×10$^{16}$ atoms/cm$^2$, and wherein the Ge is implanted at an energy of approximately 20 to 100 keV.

14. The transistor of claim 13, wherein the Ge is dispersed in the substrate to a depth of approximately 100 to 1,000 angstroms.

15. The transistor of claim 13, wherein the Ge is dispersed in the substrate to a depth of approximately 300 angstroms and the germanium molar fraction is about 0.4.

* * * * *